(12) United States Patent
Steenstra

(10) Patent No.: US 10,096,450 B2
(45) Date of Patent: Oct. 9, 2018

(54) CONTROL SYSTEM AND METHOD FOR LITHOGRAPHY APPARATUS

(71) Applicant: MAPPER LITHOGRAPHY IP B.V., Delft (NL)

(72) Inventor: Herre Tjerk Steenstra, Ridderkerk (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 170 days.

(21) Appl. No.: 14/979,583

(22) Filed: Dec. 28, 2015

(65) Prior Publication Data

US 2017/0186582 A1   Jun. 29, 2017

(51) Int. Cl.
| | |
|---|---|
| H01J 37/00 | (2006.01) |
| H01J 37/24 | (2006.01) |
| H01J 37/04 | (2006.01) |
| H01J 37/317 | (2006.01) |

(52) U.S. Cl.
CPC .......... H01J 37/243 (2013.01); H01J 37/045 (2013.01); H01J 37/3174 (2013.01)

(58) Field of Classification Search
CPC ..... H01J 37/243; H01J 37/3174; H01J 37/045
USPC .......................................... 250/492.1–492.3
See application file for complete search history.

(56) References Cited

U.S. PATENT DOCUMENTS

| | | | |
|---|---|---|---|
| 5,661,700 A * | 8/1997 | Weppler | G04G 7/00 368/10 |
| 5,988,846 A | 11/1999 | Flamm | |
| 6,535,528 B1 | 3/2003 | Rhodes et al. | |
| 6,897,458 B2 * | 5/2005 | Wieland | B82Y 10/00 250/396 R |
| 6,958,804 B2 | 10/2005 | Wieland et al. | |
| 7,019,908 B2 | 3/2006 | van 't Spijker et al. | |
| 7,084,414 B2 | 8/2006 | Wieland et al. | |
| 7,129,502 B2 | 10/2006 | Kruit | |
| 8,640,070 B2 | 1/2014 | Assad et al. | |
| 2005/0066062 A1 * | 3/2005 | Hartwich | G05B 19/042 710/1 |
| 2007/0064213 A1 | 3/2007 | Jager et al. | |
| 2007/0165594 A1 | 7/2007 | Heinle et al. | |
| 2009/0212229 A1 | 8/2009 | Wieland et al. | |
| 2009/0261267 A1 | 10/2009 | Wieland et al. | |
| 2010/0001770 A1 | 1/2010 | Bogenberger et al. | |
| 2010/0100759 A1 | 4/2010 | Blixt et al. | |
| 2011/0042579 A1 | 2/2011 | de Boer et al. | |

(Continued)

FOREIGN PATENT DOCUMENTS

DE   4215380 A1   11/1993

*Primary Examiner* — Michael Maskell
(74) *Attorney, Agent, or Firm* — Hoyng Rokh Monegier LLP; David P. Owen

(57) ABSTRACT

A method for initializing a first operation in a first module at a first start time value in a first time base, the method comprising generating a clock signal, generating a second time base in the first module based on the clock signal, determining a second sync value in the second time base, determining a first sync value in the first time base corresponding to a second sync value in the second time base, determining a start trigger value in the second time base based on the first sync value and the start time value in the first time base, and initializing the first operation in the first module based on the start trigger value and a current value of the second time base in the first module.

24 Claims, 8 Drawing Sheets

(56) References Cited

U.S. PATENT DOCUMENTS

| | | |
|---|---|---|
| 2011/0073782 A1 | 3/2011 | Wieland |
| 2011/0079730 A1 | 4/2011 | Wieland |
| 2011/0216299 A1 | 9/2011 | Steenbrink |
| 2012/0005517 A1 | 1/2012 | Foster et al. |
| 2012/0091358 A1 | 4/2012 | Wieland |
| 2012/0286168 A1 | 11/2012 | Derks et al. |
| 2015/0144801 A1* | 5/2015 | Biberger ............... H01J 37/045 250/396 R |

* cited by examiner

CONTROL SYSTEM AND METHOD FOR LITHOGRAPHY APPARATUS

BACKGROUND OF THE INVENTION

1. Field of the Invention

The invention relates generally to a method and system for initialising operations in modules of system, and more particularly to method and system for synchronizing the initialisation of operations in two or more modules of system such as a charged particle lithography system.

2. Description of the Related Art

A charged particle lithography apparatus typically comprises several modules for carrying out respective operations. Modules comprise e.g. an illumination optics module which includes a charged particle beam source, an aperture array module, a beam switching module which includes a beamlet blanker array, a pattern data streaming module, a projection optics module that could include a beam deflector array and the projection lens arrays, and a stage control module for controlling a moveable wafer stage carrying a wafer.

The modules or subsystems of the lithography apparatus perform respective operations according to instructions transmitted to the respective modules. These instructions may comprise, an identifier or address of a module, an indication of an operation to be performed by the module, and a starting time when the module is to start performing the operation.

The operations performed by different modules must often be synchronized with each other, for example the modulation of charged particle beamlets must be synchronized with the scanning of the beamlets across the surface of a wafer, and these operations must be synchronized with movement of the wafer stage. As the patterning resolution of the lithography apparatus increases, and the number of charged particle beamlets increases, the required precision of this synchronization of operations becomes greater.

In prior art systems the controller and the subsystems each include clock circuits which are synchronized. However, and increasing the accuracy of the clock circuits and the accuracy of their synchronization require complex and costly solutions.

BRIEF SUMMARY OF THE INVENTION

The present invention aims to provide improved accuracy for performing, and in particular starting, respective one or more operations by one or more modules in a lithography apparatus.

According to one aspect of the invention, a method and system for controlling starting one or more operations in one or more modules in a lithography device is provided. The one or more modules can be connected to a controller over a network.

In one aspect, the invention comprises a method for initializing a first operation in a first module at a first start time value in a first time base, the method comprising generating a clock signal, generating a second time base in the first module based on the clock signal, determining a second sync value in the second time base, determining a first sync value in the first time base corresponding to a second sync value in the second time base, determining a start trigger value in the second time base based on the first sync value and the start time value in the first time base, and initializing the first operation in the first module based on the start trigger value and a current value of the second time base in the first module.

The first time base may comprise a time scale, e.g. measured in days and/or hours and/or minutes and/or seconds and subdivisions thereof. The first time base may be generated by a clock circuits in the each of the modules, or in a master clock circuit or controller or other circuit communicating with the modules. The step of determining the first sync value may comprise generating a sync signal, and determining the first sync value in dependence on a time of receipt of the sync signal in the first time base. This may step comprise storing a time indicated by the clock circuit(s) which generate the first time base when the sync signal is received by the unit with the clock circuit(s).

The second time base may be different from the first time base, but in some embodiments they may be the same. The second time base may comprise a count value generated from the clock signal. Each module may include a count circuit for generating the count value based on the clock signal. The second sync value may correspond to a value in the second time base determined by receipt of a sync signal. When the second time base comprises a count value, the second sync value may comprise a reset value of the count value, e.g. the determining the second sync value may comprise resetting the count circuit(s) which generate the count value based on receipt of the sync signal. The sync signal may be combined with the clock signal to form a single combined signal which is used for determining the first and second sync values.

When the first sync value is a time in the first time base representing a time of receipt of a sync signal, and the second time base is a count value which is reset upon receipt of the sync signal, then the first sync value indicates the time (in the first time base) when the second time base (i.e. the count value) is reset. In this way, the first and second time bases can be synchronized.

The step of determining the start trigger value may comprise determining a relative start time in the first time base based on the start time value and the first sync value, wherein the start trigger value is a value in the second time base corresponding to the relative start time in the first time base. Determining the relative start time may comprise calculating a difference between the first sync value and the start time value in the first time base, e.g. by subtracting the first sync value from the start time value. Determining the start trigger value may comprise: determining a relative start time in the first time base based on the start time value and the first sync value, wherein the start trigger value corresponds to a count value in the second time base corresponding to the relative start time in the first time base. When the second time base is a count value, the relative start time represents the amount of time in the first time base since the reset of the second time base count value.

When the second time base is a count value, the first operation may be initialised when the count value corresponds to the start trigger value.

The method may further comprise initiating a second operation in a second module, comprising: generating the second time base in the second module based on the clock signal, and initializing the second operation in the second module based on the start trigger value and a current value of the second time base in the second module. The second time base may comprise a count value generated in each of the first and second modules from the clock signal. The second sync value may correspond to a reset of the count value in each of the first and second modules. The method may further comprise initiating a third operation in a third module, comprising generating the second time base in the third module based on the clock signal, and initializing the third operation in the third module based on the start trigger value and a current value of the second time base in the third module.

When applied in a lithography system, the first module may comprise a stage control module and the first operation may comprise a predetermined movement of the stage during a scan, the second module may comprise a projection optics module and the second operation may comprise a predetermined scanning deflection of the unblanked beamlets across the surface of target, and the third module may comprise a pattern data streaming module and the third operation may comprise transmission of a predetermined portion of data to a beam switching module for blanking selected ones of the charged particle beamlets.

The first module may be one of a plurality of modules connected to a controller via a first network, and the controller may transmit one or more instructions identifying the first operation via the first network to the first module.

The clock signal may be transmitted to the plurality of modules via a second network, and the second time base may comprise a count value, and each of the modules separately generates a count value from the clock signal.

The first sync value may be determined by the controller or by the modules in dependence on a time of receipt of a sync signal in the first time base, and the second sync value is set in the first module at a value in the second time base determined by receipt of the sync signal.

The first sync value may be determined by the first module in dependence on a time of receipt of a sync signal in the first time base, and the second sync value may be set in the first module at a value in the second time base determined by receipt of the sync signal. In this way, the sync signal, the sync signal can be used to synchronize the first and second time bases. The clock signal and the sync signal may be combined and transmitted to the plurality of modules via the second network. The clock signal and combined clock signal (i.e. including the sync signal) may both be distributed to the modules, or the combined clock signal alone may be distributed to the modules.

The controller may determine the start time value and the start trigger value and transmit the start trigger value to the first module via the first network. Alternatively, the controller may determine the start time value and transmit the start time value to the first module via the first network, and the first module determines the start trigger value. Alternatively, the first module may determine both the start time value and the start trigger value. In another alternative, the controller may determine a relative start time in the first time base based on the start time value and the first sync value, and transmit the relative start time to the first module, and the first module may determine the start trigger value based on the relative start time.

The first and second modules may be connected to a controller via a first network, and the controller may transmit the start time value and/or the start trigger value to the first module, and transmit one or more instructions identifying the first operation to be initiated to the first module via the first network, and the controller may further transmit the start time value and/or the start trigger value and one or more instructions identifying the second operation to be initiated to the second module via the first network.

In another aspect, the invention comprises a system for initializing a first operation in a first module at a first start time value in a first time base. The system comprises a clock for generating a clock signal, a circuit for generating a second time base in the first module based on the clock signal, a circuit for determining a first sync value in the first time base corresponding to a second sync value in the second time base, and a circuit for determining a start trigger value in the second time base based on the first sync value and the start time value in the first time base. The first module comprises a circuit for initializing the first operation in the first module based on the start trigger value and a current value of the second time base. Each of the circuit for generating a second time base, the circuit for determining a first sync value, the circuit for determining a start trigger value, and the circuit for initializing the first operation in the first module may comprise hardware circuits, a processor for executing software or firmware, an ASIC, or a programmable circuit, or combination of these.

The circuit for determining a first sync value may be adapted for determining the first sync value in dependence on a time of receipt of a sync signal in the first time base, and may further comprise a circuit for determining the second sync value, adapted for determining the second sync value corresponding to a value in the second time base determined by receipt of a sync signal by the first module. The sync signal may be combined with the clock signal, and the combined clock signal (which includes the sync signal) may be transmitted to the first module.

The circuit for generating a second time base may comprise a count circuit for generating a count value from the clock signal. The second sync value may correspond to a reset value of the count circuit.

The circuit for determining a start trigger value may be adapted to determine a relative start time in the first time base based on the start time value and the first sync value, wherein the start trigger value is a value in the second time base corresponding to the relative start time in the first time base. In particular, the circuit for determining a start trigger value may be adapted to determine the relative start time by calculating a difference between the first sync value and the start time value. The circuit for determining a start trigger value may be adapted to determine a relative start time in the first time base based on the start time value and the first sync value, wherein the start trigger value corresponds to a count value in the second time base corresponding to the relative start time in the first time base.

The circuit for initializing the first operation may be adapted to initialise the first operation when the count value corresponds to the start trigger value.

The first and second time bases may different from each other or the same, e.g. both being count values or both being measured in the same units of time. The first time base may be measured in days and/or hours and/or minutes and/or seconds and/or subdivisions thereof.

The system may be further adapted for initiating a second operation in a second module, wherein the system further comprises a circuit for generating a second time base in the second module based on the clock signal, wherein the second module comprises a circuit for initializing the second operation in the second module based on the start trigger value and a current value in the second time base. For this system, the second time base may comprise a count value generated in each of the first and second modules from the clock signal. The second sync value may correspond to a reset of the count value in each of the first and second modules. The first module comprises a stage control module and the first operation comprises a predetermined movement of the stage, and the second module may comprise a beamlet deflection module and the second operation comprises a predetermined movement of the beamlets.

The system may be yet further adapted for initiating a third operation in a third module, wherein the system further comprises a circuit for generating a second time base in the third module based on the clock signal, wherein the third module comprises a circuit for initializing the third operation in the third module based on the start trigger value and a current value in the second time base. The first module may comprise a stage control module and the first operation comprises a predetermined movement of the stage, and the second module may comprise a beamlet deflection module and the second operation may comprise a predetermined movement of the beamlets, and the third module may comprise a pattern streamer module and the third operation comprises a transmission of a predetermined portion of data for modulating the beamlets.

The first module may be one of a plurality of modules connected to a controller via a first network, and the controller transmits one or more instructions identifying the first operation via the first network to the first module. The controller may further transmit one or more instructions identifying a second operation via the first network to a second module. The clock signal may be transmitted to the plurality of modules via a second network. The second time base may comprise a count value, and each of the modules may separately generate a count value from the clock signal.

The first sync value may be determined by the controller in dependence on a time of receipt of a sync signal in the first time base, and the second sync value may be set in the first module at a value in the second time base determined by receipt of the sync signal.

The first sync value may be determined by the first module or by the controller in dependence on a time of receipt of a sync signal in the first time base, and the second sync value may be set in the first module at a value in the second time base determined by receipt of the sync signal by the first module. The second sync value may be set in each of the plurality of modules at a value in the second time base determined by receipt of the sync signal by each of the respective modules.

The first and second modules may be connected to a controller via a first network, and the controller may transmit the start time value and/or the start trigger value and one or more instructions identifying the first operation to be initiated to the first module via the first network. The controller may further transmit the start time value and/or the start trigger value and one or more instructions identifying the second operation to be initiated to the second module via the first network.

In another aspect, the invention includes a charged particle lithography system comprising: a charged particle beam source for producing a charged particle beam, an aperture array for generating a plurality of charged particle beamlets from the charged particle beam, a beam switching module including a beamlet blanker array comprising blanking electrodes for blanking selected ones of the charged particle beamlets, a pattern data streaming module for transmitting pattern data to the beam switching module, a projection optics module including a beam deflector array for scanning the unblanked beamlets across the surface of target, a moveable stage for carrying the target, and a stage control module for controlling movement of the moveable stage. The lithography system further comprises a system adapted for initializing a first operation in a first module as described above, which may be further adapted for initializing a second operation in a second module as described above, and further a third operation in a third module as described above. The first module may comprise the stage control module and the first operation may comprise a predetermined movement of the stage during a scan. The second module may comprise the projection optics module and the second operation may comprise a predetermined scanning deflection of the unblanked beamlets across the surface of target. The third module may comprise the pattern data streaming module and the third operation may comprise transmission of a predetermined portion of data to the beam switching module for blanking selected ones of the charged particle beamlets.

BRIEF DESCRIPTION OF THE DRAWINGS

Various aspects of the invention will be further explained with reference to embodiments shown in the drawings wherein.

DESCRIPTION OF ILLUSTRATIVE EMBODIMENTS

The following is a description of various embodiments of the invention, given by way of example only and with reference to the drawings.

Figure 1:
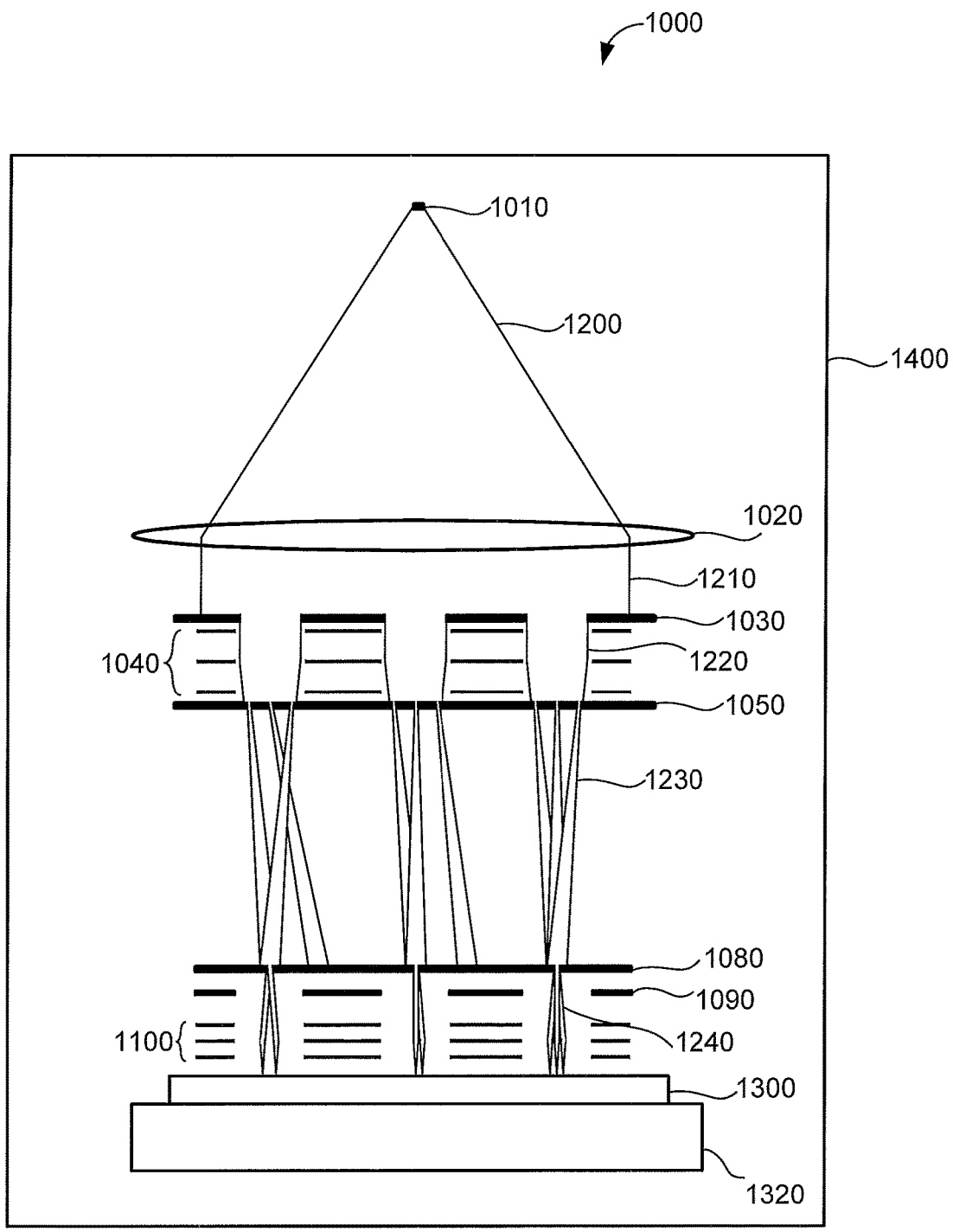
FIG. 1 is a simplified schematic drawing of an embodiment of a charged particle lithography system.

FIG. 1 shows a simplified schematic drawing of an embodiment of a charged particle lithography system 1000. Such lithography systems are described for example in U.S. Pat. Nos. 6,897,458 and 6,958,804 and 7,019,908 and 7,084,414 and 7,129,502, U.S. patent application publication no. 2007/0064213, and U.S. patent applications Ser. Nos. 61/031,573 and 61/031,594 and 61/045,243 and 61/055,839 and 61/058,596 and 61/101,682, which are all assigned to the owner of the present invention and are all hereby incorporated by reference in their entirety.

In the embodiment shown in FIG. 1, the lithography system comprises a charged particle source 1010 for producing an expanding charged particle beam 1200 which is collimated by collimator lens system 1020. The collimated charged particle beam 1210 impinges on an aperture array 1030, which blocks part of the beam to create a plurality of sub-beams 1220, which impinge on second aperture array (formed integrally with the beamlet blanker array 1050) to create a large number of charged particle beamlets 1220, preferably about 10,000 to 1,000,000 beamlets. The beamlets could alternatively be created from a single aperture array, from multiple charged particle sources, or a combination of these.

The charged particle beamlets 1220 pass through a condenser lens array 1040, which focuses the beamlets 1220 in the plane of a beam blanker array 1050, comprising a large number of blanking electrodes arranged at each aperture of the second aperture array for deflecting the individual beamlets. The deflected and undeflected beamlets 1230 arrive at beam stop array 1080, which has a plurality of apertures. The beamlet blanker array 1050 and beam stop array 1080 operate together to block or let pass the beamlets 1230. If beamlet blanker array 1050 deflects a beamlet, it will not pass through the corresponding aperture in beam stop array 108, but instead will be blocked. But if beamlet blanker array 1050 does not deflect a beamlet, then it will pass through the corresponding aperture in beam stop array 1080, and through beam deflector array 1090 and projection lens arrays 1100 onto the surface of target 1300. A pattern data streamer transmits pattern data to the beamlet blanker array 1050, the pattern data comprising data for energizing the blanker electrodes to control the blanking selected ones of the charged particle beamlets.

Beam deflector array 1090 provides for deflection of each unblanked beamlet 1240 in the X and/or Y direction, substantially perpendicular to the direction of the undeflected beamlets, to scan the beamlets across the surface of target 1300. Beamlets 1240 next pass through projection lens arrays 1100 and are projected onto target 1300. The projection lens arrangement preferably provides a demagnification of about 100 to 500 times. The beamlets 1240 impinge on the surface of target 1300 positioned on moveable stage 1320 for carrying the target, the movement of the moveable stage (1320) being controlled by a stage control module.

For lithography applications, the charged particle beams are usually electron beams, and the target usually comprises a wafer provided with a charged-particle sensitive layer or resist layer.

Figure 2:
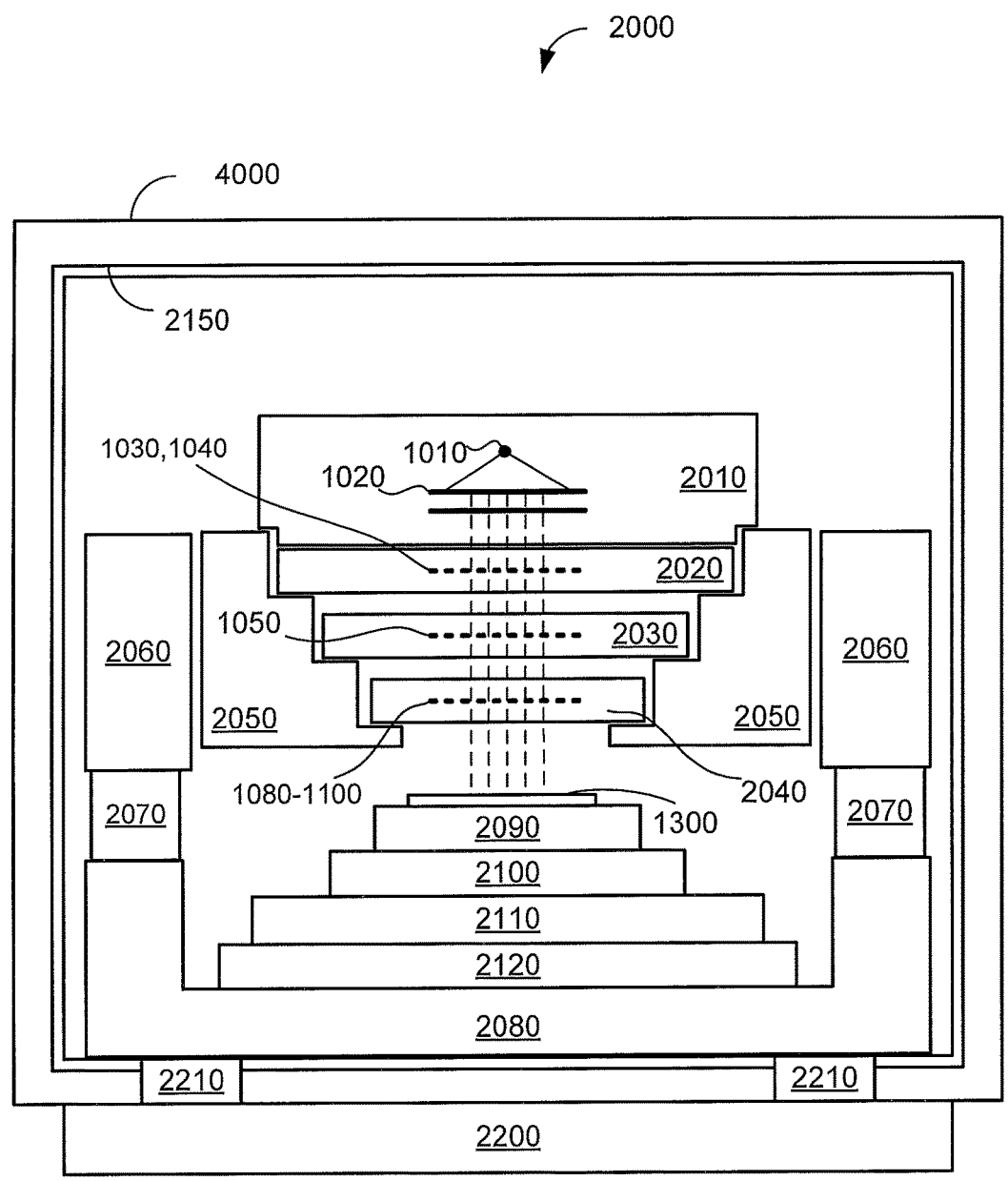
FIG. 2 is a simplified schematic example of an arrangement of modules in a charged particle lithography system.

FIG. 2 shows a simplified block diagram illustrating the principal elements of a modular lithography system. In this application 'module' will refer to any subsystem or unit that can perform an operation, cooperating within a larger system such as a lithography system.

In the embodiment shown in FIG. 2, the subsystems include:
 an illumination optics module 2010 including the charged particle beam source 1010, and optionally also including beam collimating system 1020;
 an aperture array module 2020 including aperture array 1030, and optionally also including condenser lens array 1040;
 a beam switching module 2030 including beamlet blanker array 1050; and
 a projection optics module 2040 including beam deflector array 1090, and optionally also including beam stop array 1080 and projection lens arrays 1100.

In the embodiment shown in FIG. 2, the subsystems are designed to slide in and out from an alignment frame comprising an alignment inner subframe 2050 and an alignment outer subframe 2060. A frame 2080 supports the alignment subframes 2050 and 2060 via vibration damping mounts 2070. The wafer 1300 rests on wafer table 2090, which is in turn mounted on chuck 2100. Chuck 2100 sits on the stage short stroke 2110 and long stroke 2120. Each of the short stroke and long stroke stage forms a module in accordance with the invention. Each stage 2110, 2120 can perform a movement operation.

The lithography machine is enclosed in vacuum chamber 4000, which includes a mu metal shielding layer or layers 2150. The machine rests on base plate 2200 supported by frame members 2210.

Figure 3:
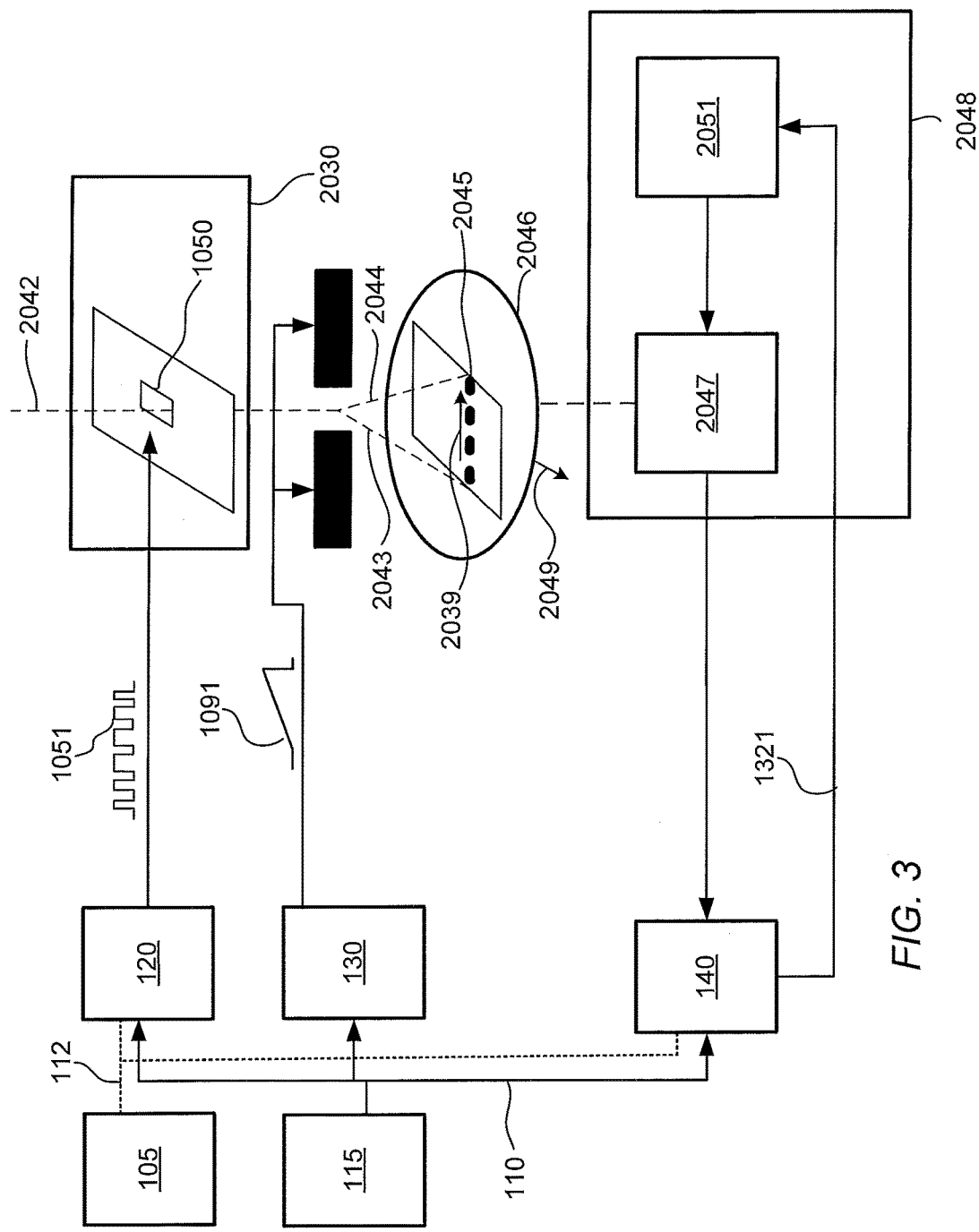
FIG. 3 is a simplified schematic example of communication between modules in a charged particle lithography system.

FIG. 3 is a simplified schematic example of communication between modules in a charged particle lithography system, such as the system according to FIGS. 1 and 2.

A controller 105 is connected via a first communication network 110 to modules 120,130,140. The modules 120, 130,140 are capable of receiving and executing instructions from the control 100 via the first communication network 110, for performing or controlling certain operations in a lithography system.

The controller 105 is arranged to schedule one or more operations to be performed by one or more of the modules 120,130,140, so that operations can be initiated by one or more of the modules at a desired start time. In particular, the time of initiation of an operation may be coordinated in multiple modules, e.g. so that the operation is initiated at the same time in multiple modules, or the operation is initiated in multiple modules at different times having a predetermined temporal relation to each other. Further, the time of initiation of different operations in different modules may be coordinated, e.g. so that a first operation is initiated by a first module at the same time as a second operation is initiated by a second module, or the first and second operations are initiated by the first and second modules at different times having a predetermined temporal relation to each other.

In this embodiment, module 120 is a pattern data streamer adapted to transmit pattern data to the beamlet blanker array 1050. The output from module 120 comprises a blanker signal 1051 which is a high frequency serial signal for switching the large number of blanking electrodes of the blanker array 1050 to blank or let pass each beamlet. Module 130 is a module for control of the beam deflector array 1090. The output from module 130 comprises a deflection voltage signal 1091 which control deflection of the unblanked beamlets to scan the beamlets across the surface of the wafer 2046, over a deflection domain indicated by dotted lines 2043,2044, so that an exposed pattern 2045 is formed on wafer 2046. Module 140 is a module for control of the movement of the stage 2047 on which the wafer 2046 is positioned. During each scan, the wafer 2046 may move continuously in a direction 2049 (approximately) perpendicular to the deflection direction 2039 (further deflectors can be operated to compensate for this continuous movement). The output from module 140 comprises a movement signal 1321 to controller 2051 that outputs signals to activate the stage drive system for moving stage 2047.

The operations of deflecting the beamlets, deflecting the unblanked beamlets, and moving the stage need to be accurately coordinated in order to minimize overlay error. The blanker signal 1051 from module 120 must be precisely aligned with the deflection voltage signal 1091 from module 130 and with the movement signal 1321 from module 140. During each scan, to form the desired pattern on the wafer, each beamlet must be blanked or not at the precise moment when the scan deflection and the stage movement places the beamlet at a particular position on wafer. When there are a very large number of beamlets the required precision becomes more difficult. For example, if there are one million beamlets, the blanker signal 1051 must transmit one million pulses to control the blanking of the one million beamlets in a short period of time, all precisely coordinated with the deflection voltage signal 1091 and movement signal 1321. During each scan, to form the desired pattern on the wafer, each beamlet must be blanked or not at the precise moment when the scan deflection and the stage movement places the beamlet at a particular position on wafer. This requires precise coordination between the modules 120, 130 and 140. At the beginning of a scan, the beamlet blanking operation in module 120 and the beamlet deflection operation in module 130 and the stage movement operation in module 140 must all be initiated with precisely coordinated timing to align the blanker signal 1051 with the deflection voltage signal 1091 and with the movement signal 1321.

Figure 4:
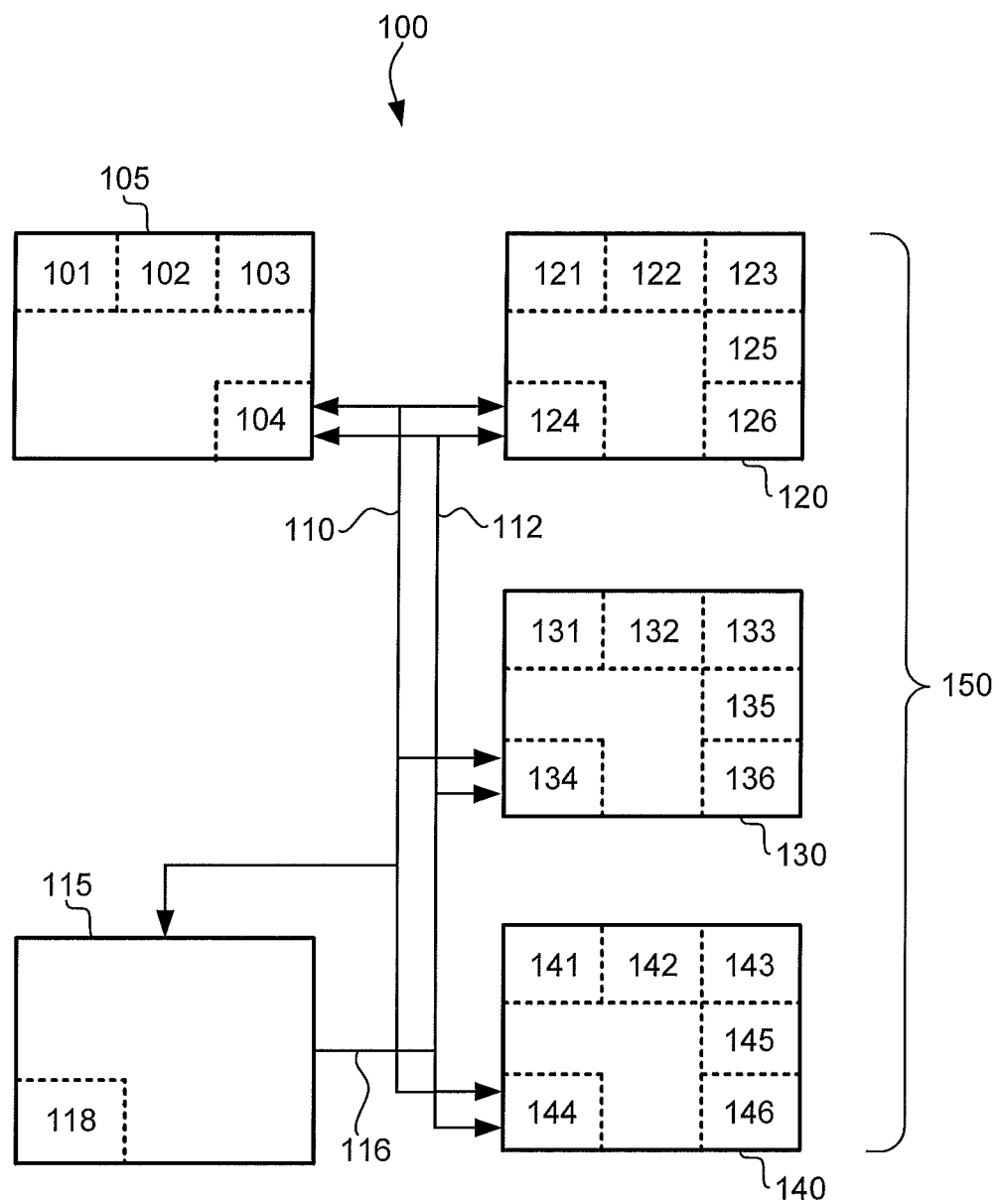
FIG. 4 is a simplified schematic example of a controller in communication with modules suitable for implementing the invention.

FIG. 4 is a simplified schematic example of a system 100 with a controller 105 in communication with modules 120, 130,140 suitable for implementing the invention. The controller 105 in communication with modules 120,130,140 may perform the operations described above with reference to FIG. 3, but they may instead or additionally perform other operations in a lithography system, or may be applied to systems other than a lithography system for performing completely different operations.

The controller 105 is connected via a first communication network 110 to one or more modules 150. The controller 105 is arranged to control and schedule operations to be performed or controlled by the individual modules 120,130,140 (collectively 150), and the modules 150 are capable of receiving and executing instructions from the controller 105 via the first communication network 110. In this context, scheduling an operation comprises specifying a start time for a module to initiate the performance of an operation. The embodiment shown includes three modules 120,130,140, although a smaller or larger number of modules may be connected to the controller.

The controller 105 comprises a processor 101 such as a microprocessor, microcontroller, ASIC, field-programmable gate array, or similar for executing software, firmware or programmable logic, and memory 102 for storing software, firmware, programmable logic and/or data. The controller 105 also comprises a network communication unit 104 for sending and receiving messages and data over the first communication network 110, and may also comprise a clock unit 103 (described in further detail below).

The modules 150 similarly each comprise a processor 121,131,141 such as a microprocessor, microcontroller, ASIC, field-programmable gate array, or similar for executing software, firmware or programmable logic, memory 122,132,142 for storing software, firmware, programmable logic and/or data, and a network communication unit 124, 134,144 for sending and receiving messages and data over the first communication network 110, and may also comprise a clock unit 123,133,143 (described in further detail below).

The controller 105 may perform the control and scheduling in accordance with input from an operator, host computer, or similar. An input/output unit including a display may be connected to controller. The network 110 connects the controller 105 with the modules 150. Controller 105 can send instructions over the network 110 to the respective modules 150 and can receive messages such as acknowledgements and logging messages over the network 110 from the modules 150. The network 110 can be a wired or wireless network, and can be bi-directional or may comprise two uni-directional networks to achieve bi-directional communication between the controller 105 and modules 150.

The system 100 operates using two time bases. The first time base provides a relative or absolute time value or a periodic indication of time in accordance with the first time base. The first time base is preferably based on a time scale suitable for scheduling systems used for scheduling operations in the modules, and may conveniently be selected as a time scale readily understandable for human operators, such as days and/or hours and/or minutes and/or seconds and/or subdivisions thereof, or a combination of these. For example, the first time base may take the form of hh:mm:ss.ssss to represent time in hours, minutes, seconds, and subdivisions of seconds. The first time base is designed to enable precise definition of a time for performing an operation. The first time base also preferably enables coordination between the operations performed in the system 100 with operations performed in other related and/or unrelated systems. For example, the first time base may be the same time base used throughout a fab for coordinating operation of a lithography tool with wafer loading and unloading machines and machines performing other operations on the wafers.

The second time base also provides a relative or absolute time value or a periodic indication of time, but preferably differs from the first time base. The second time base is designed to enable distribution of the time base to multiple modules to enable precise coordination of operations performed by the modules. The second time base is designed to enable precise coordination between multiple modules in accordance with a time for performing an operation defined in the first time base. In one embodiment, the second time base is a count value derived from a high frequency clock signal.

In one embodiment the controller 105 and modules 120, 130,140 each have a clock unit 103, 123,133,143. The clock unit provides a relative or absolute time value or a periodic indication in accordance with the first time base. The clock units of the controller 105 and modules may be synchronized to each other, e.g. using an NTP protocol or other suitable protocol or algorithm for synchronization.

The controller 105 can schedule one or more operations to be performed by one or more of the modules 150 at a respective moment. The start time of an operation can be indicated by a first start time value, which is provided in accordance with the first time base. For example, operation YYY of module 120 is to start at first start time value t1=1 h 23 m 45 s 678 ms, and the controller 105 sends an instruction comprising an indication of the operation YYY in combination with an indication of start time t1 as a scheduling instruction over the network 110 to module 120. In a legacy system, module 120 would start performing operation YYY when it's clock unit 123 indicates a time corresponding to the start time t1.

In one embodiment, the system 100 includes a master clock 115 which generates a repetitive periodic signal 116. The periodic signal 116 is generated according to a second time base, which may be different from or the same as the first time base. The periodic signal 116 is referred to herein as master clock pulse 116, although it may take other forms such as a frequency, phase or amplitude modulated high frequency signal, digital count, multi-level signal etc. An operation may be initiated at one of the modules 120 at a time according to the received master clock signal 116. In one embodiment, the master clock signal 116 is a clock having a frequency of at least 10 MHz, preferably at least 24 MHz, more preferably at least 49 MHz. The clock signal 116 may be a square-wave, triangular-wave, sinewave, pulse, or any other signal suitable for transmitting a high frequency repetitive signal, The master clock 115 may comprise an oscillator circuit or similar circuit for generating the signal 116, and may be a separate unit as in the FIG. 4 embodiment or may be incorporated into the controller 105.

The master clock 115 distributes the master clock signal 116 to the modules 150, preferably over a second network 112 different from the first network 110. In an embodiment the master clock signal 116 is also provided over the second network 112 to the controller 105. The second network 112 preferably is designed to provide for a constantly reproducible and substantially equal distribution delay of the master clock signal 116 to the modules 120. The propagation delay over the network 112 between the master clock 115 and the modules 150 is preferably minimal, constant (not varying over time or dependent on variables such as network traffic etc.), and is substantially the same for all the modules 150 (i.e. different modules receive the clock signal 116 at substantially the same time). The second network 112 may be embodied by wire cables, optical fibers, wireless links, or a combination of these.

In one embodiment two master clock signals 116 can be provided by the master clock 115.

By using a master clock signal 116 distributed to the modules 150, wherein the distribution is reproducible and constant over time, each module will receive the master clock signal 116 and operations can be initiated in each module at instants determined according to the received master clock signal 116, i.e. in accordance with the second time base. Due to differences in times of receiving and processing the master clock signal 116 at the respective module or as a result of a longer connecting wire (resulting in a longer travel time of the master clock signal 116 to the module), the trigger time provided by the master clock signal 116 may be at not exactly the same time. The differences in receiving and processing at each module result in a relative, but constant deviation at each module. Subsequent triggered starts of operations will have the same (reproducible) deviation, resulting in a constant deviation. Such a constant deviation does not influence e.g. the overlay error. Such a constant deviation may also be measured and compensated for.

Figure 7:
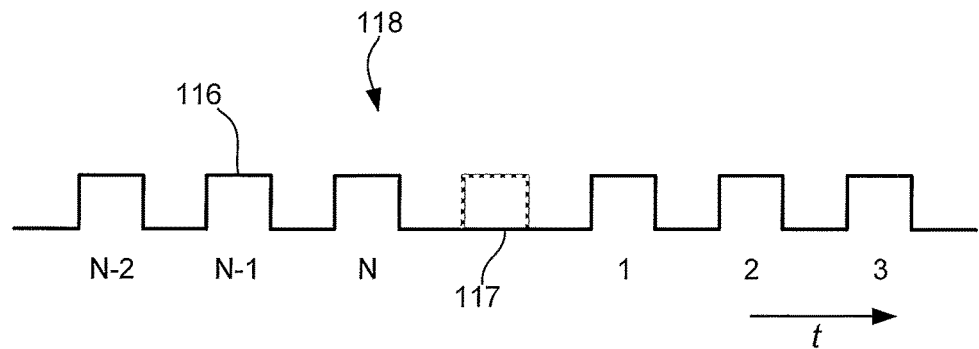
FIG. 7 is an embodiment of a combined clock signal comprising a clock signal and sync signal.

An example master clock signal 116 comprising a square-wave is shown in FIG. 7. A trigger property is defined for the master clock signal 116, which may be used by the modules 150 as a trigger to initiate an operation. For example, the trigger property of a square-wave master clock signal may be a clock edge, i.e. a rising edge, a falling edge, or both rising and falling edges. For example, a 10 MHz clock signal with a trigger property occurring once per period of the signal results in a period of 100 nanoseconds between receiving successive trigger properties. The rising edge of a high-precision square-wave signal can provide a very precise trigger point, which can increase the resolution of a trigger derived from a 10 MHz clock signal by a factor of about 1,000 times, resulting in sub-nanosecond accuracy of the trigger property.

In an embodiment the trigger property is provided at each module, e.g. in a memory 122,132,142. In another embodiment the trigger property is sent from the controller 105 or master clock 115 to the modules 150. In yet another embodiment the trigger property is provided to the controller 105. Other different trigger properties may be used that can also allow for a nanosecond accuracy.

The master clock signal 116 in combination with the trigger property provide a second time base. The second time base is preferably a highly precise time base with a time precision at least as great as the desired precision for starting operations in the modules 150. The master clock signal 116 and trigger property preferably allow nanosecond and preferably sub-nanosecond (relative) synchronization of operations in the modules 150. Note that the trigger property and master clock 115 can be added onto a legacy system, resulting only in some extra connections and some small software adaptations, preferably only at the modules, resulting in an increase of the accuracy in the synchronization of operations in a lithography apparatus.

If e.g. every occurrence of a trigger property in the master clock signal 116 is counted, using a suitable count circuit, the number of counts can be a second time base. Each module 150 may be provided with a count circuit 135,135, 145. Clearly within the scope of the invention many different forms of providing a second time base can be provided.

In a further embodiment the trigger property also comprises the frequency of the master clock signal 116. When the frequency of the master clock signal 116 is known, the modules 150 are able to convert a start time in the first time base into a start time in the second time base.

In a further embodiment, synchronization of the second time base in the modules 150 can be accomplished using a synchronization ('sync') signal distributed to the modules 150. In one embodiment, a reset unit 126,136,146 is provided in each module for detecting the sync signal and resetting the second time base in each module. In one embodiment the reset unit in each module is arranged to reset the respective count circuit 125,135,145 in each module upon detection of the sync signal.

In one embodiment, the sync signal is generated by the master clock circuit 115, and is distributed to each module via the second communication network 112. Alternatively, the sync signal may be generated by a separate unit. The sync signal may take the form of a deviation in the master clock signal 116. The deviation, sent with the clock signal 116 over the second network 112, and when the deviation is received and recognized by the reset unit 126,136,146 in each module, the respective count circuit 125,135,145 in each module may be reset to a zero value.

Figure 5:
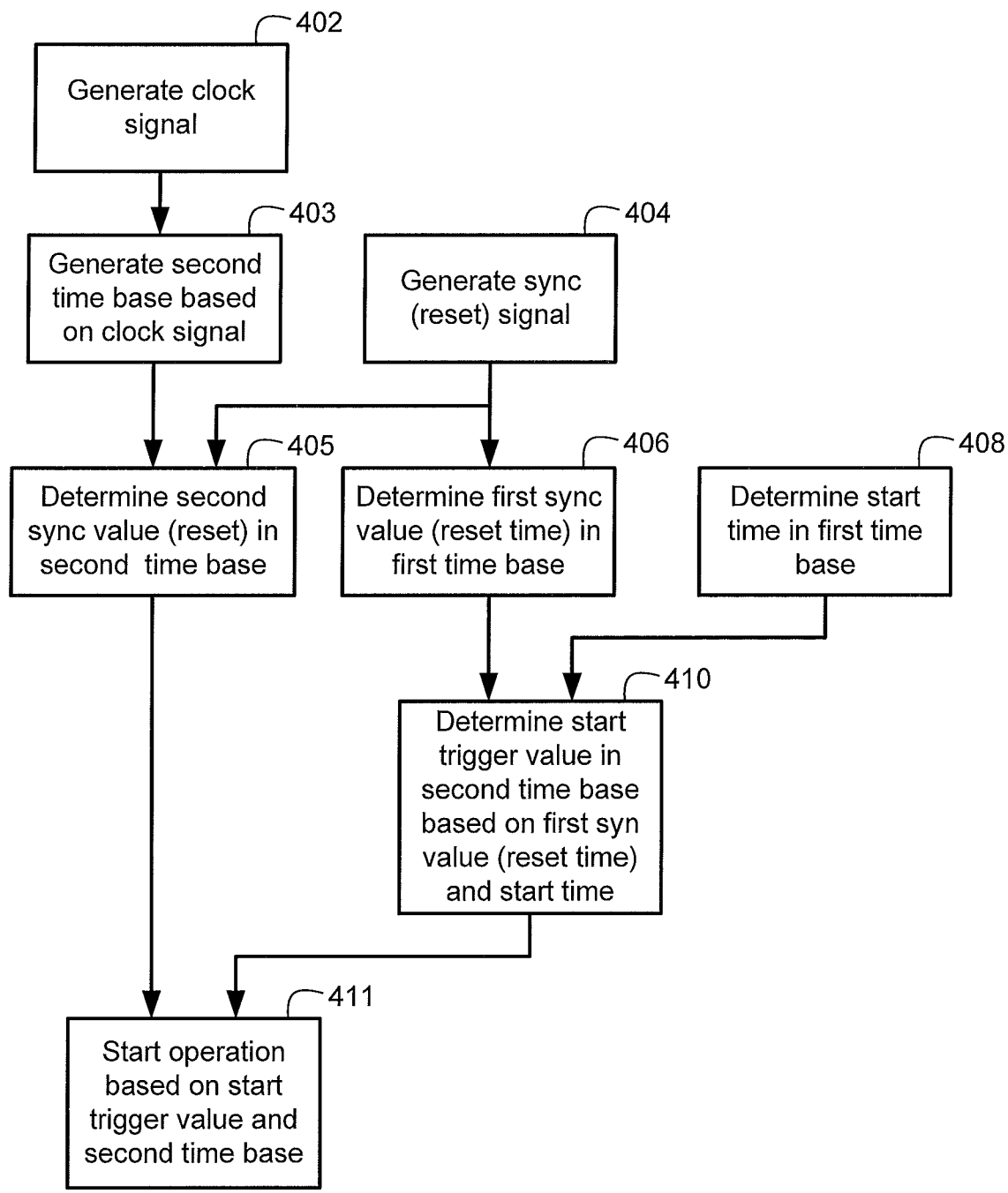
FIG. 5 is a flowchart illustrating a method for initializing an operation in a module at a first start time value in a first time base according to an embodiment of the invention.

The operation of the system 100 will now be explained further in relation to the embodiments depicted in FIGS. 5 and 6. One method is illustrated in FIG. 5 and described below for initializing a first operation in one or more of the modules 150 at a first start time value in a first time base. The method comprises generating a clock signal 116 (step 402 in FIG. 5). As described above, the clock signal may be generated by the master clock circuit 115 and distributed to the modules 150, and this may be accomplished via the second communication network 112. A time base, referred to herein as the second time base is generated in the modules 150 based on the clock signal 116 (step 403). For example, the second time base may be a comprises a count value generated from the clock signal in the count circuit 125, 135,145 of each of the modules 120,130,140.

A synchronization value (referred to as a 'sync value') may be generated and distributed to the modules 150 (step 404). As described above, the sync signal may also be generated by the master clock circuit 115, and may be distributed to the modules 150 via the second communication network 112.

The sync signal may be combined with the clock signal 116, as illustrated by the example shown in FIG. 7, to form a combined signal 118. In this example, a square wave clock signal 116 is provided by master clock 115 and sent over second network 112 to the modules 150. After the Nth cycle a deviation 117 occurs in the signal, in this case the clock signal 116 remaining 'low' for a complete clock cycle. This deviation is the sync signal 117, which appears as part of the clock signal 116 and is thus distributed to the modules 150 along with the clock signal in a combined signal 118.

A first sync value and a second sync value are determined. The second sync value is determined in the second time base (step 405). In one embodiment, the second sync value is a reset value of the second time base. Where the second time base is a count value, the second sync value may be a predetermined count value, e.g. a zero count value. This can be achieved by arranging for a reset circuit 126,136,146 for each module 120,130,140 to detect a sync signal 117 and reset the module's count circuit 125,135,145 as a result of detecting the sync signal 117. An example is illustrated in FIG. 7. If the trigger value for the second time base is a rising edge of the clock signal, e.g. the counter 125,135,145 of each module counts the rising edges, the count value (second time base) will increase by one each clock cycle as shown, up to N when the sync signal 117 is received. The counter will then reset and begin counting up again from an initial value after reception of the sync signal. In this way, the second sync value corresponds to a value in the second time base determined by receipt of the sync signal 117.

The first sync value is determined in the first time base (step 406). The first time base is different from the second time bas, and as described above, the first time base may be measured in hours and/or minutes and/or seconds and/or subdivisions thereof. The first sync value in the first time base corresponds to a second sync value in the second time base, i.e. they represent the same instant. The first sync value may be determined in dependence on a time of receipt of a sync signal 117 in the first time base.

Next, a start trigger value is determined (step 410) in the second time base based on the first sync value and the start time value in the first time base. The start trigger value may be determined by determining a relative start time in the first time base based on the start time value and the first sync value, e.g. the relative start time may be calculated as the difference between the first sync value and the start time value in the first time base. The relative start time thus represents the start time expressed as the time which has elapsed since the synchronization instant represented by the first sync value. In this example, the start trigger value is a value in the second time base corresponding to the relative start time in the first time base.

Where the second time base comprises a count value, the start trigger value corresponds to the count value which corresponds to the relative start time in the first time base. For example, if the relative start time was 10.5 seconds in the first time base, and the second time base was a count value using a rising edge of a 10 MHz clock signal, the relative start time would correspond to a count value of 10,500,000, and this count would form the start trigger value.

Then, the first operation is initialized (step 411) in one or more of the modules 150 based on the start trigger value and a current value of the second time base in the relevant module(s). For example, the first operation may be initialized when the count value of the count circuits in the relevant modules is the same as the start trigger value.

Figure 6:
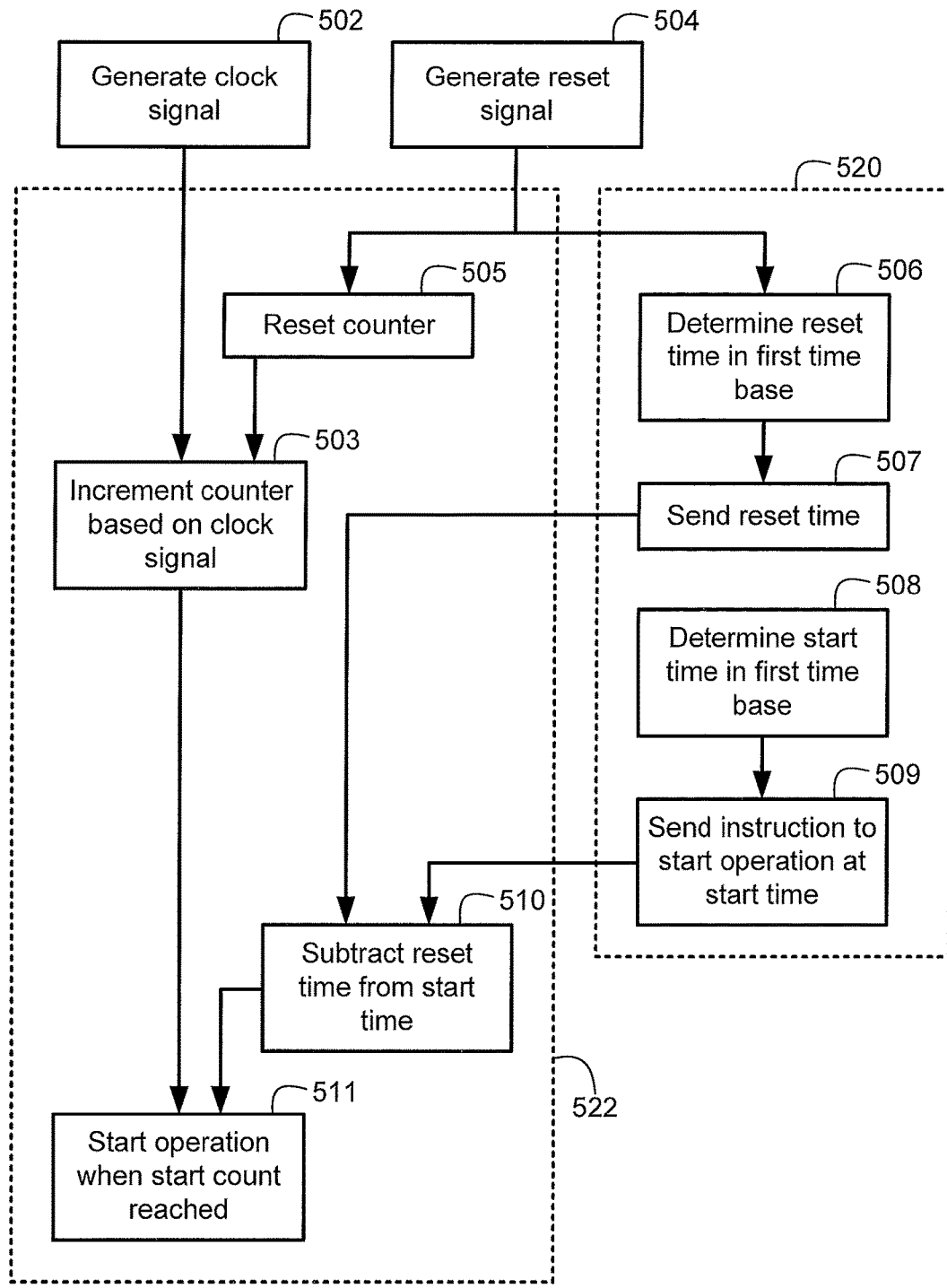
FIG. 6 is a flowchart illustrating a method for initializing an operation in a module at a first start time value in a first time base according to another embodiment of the invention.

Another method is illustrated in FIG. 6 and described below for initializing a first operation in one or more of the modules 150 at a first start time value in a first time base. This second method follows the same general procedure as the method described above in relation to FIG. 5, and the description above applies also for the method of FIG. 6 but with some variations as described below. The steps 520 are performed by the controller 105 and the steps 522 are performed by the relevant modules, although there may be some variation in this as explained below.

A clock signal 116 is generated and distributed to the modules 150 via the second network 112 (step 502 in FIG. 6, equivalent to step 402 in FIG. 5). A reset (sync) signal 117 is generated and distributed to the modules 150 (step 504, equivalent to step 404).

Upon receipt of the reset signal 117, the controller 105 determines a reset time $t_0$ (step 506, equivalent to step 406) the reset time $t_0$ being a value or signal indicating the reset time according to the first time base. For example, where the first time base is a standard 24 hour clock time, the reset time $t_0$ may correspond to 12:00:00.0000 in hours, minutes and seconds in the first time base. The controller 105 may detect the reset signal 117 (which is a signal or value according to the second time base) into the reset time $t_0$ according to the first time base, e.g. by storing a time value when the reset signal 117 was detected by the controller 105. Alternatively, the reset time $t_0$ can be first determined and the reset signal 117 sent by the master clock 115 (or by the controller 105) at an instant corresponding to the reset time $t_0$.

The controller 105 may send the reset time $t_0$ to the modules 150 (step 507), which may store the reset time $t_0$ in their memories. Alternatively, the controller 105 may determine and send a trigger value to one or more of the modules 150 instead of (or in addition to) the reset time $t_0$ as described below. The reset time $t_0$ may be sent to all the modules 150, or to a subset of the modules, and may e.g. be sent as a separate message or as part of an instruction to schedule an operation as described below.

The controller 105 determines a start time $t_1$, where the start time $t_1$ is a value or signal according to the first time base, for starting an operation in one or more of the modules 150 (step 508, equivalent to step 408). For example, where the first time base is a standard 24 hour clock time, the start time $t_1$ may correspond to 12:00:08.5000 in the first time base, e.g. exactly 8.5 seconds after a reset time $t_0$ of 12:00:00.0000. The controller may determine the start time $t_1$ from a predetermined schedule of operations, from an input of a host computer system, from an input of an operator, or from another source.

The controller 105 sends an instruction (step 509), which may be addressed to a relevant subset of one or more of the modules 150, to instruct those modules to start an operation at start time $t_1$. The controller 105 may send different instructions each indicating the same start time $t_1$, the instructions sent to different modules 150 so that different modules can be instructed to start different operations at the same start time $t_1$. In this way, different operations can be initiated in different modules 150 to begin at the same start time. The modules 150 may store the start time $t_1$ in their memories.

The modules 150 receive the clock signal 116 and the count circuits 125,135,145 in each module increment their count values according to the clock signal and the relevant trigger property (step 503, equivalent to step 403). The modules 150 also receive the reset signal 117 and the reset circuits 126,136,146 in each module cause the reset of the count values in each module (step 505, equivalent to step 405). This resets the second time base in each module 150 (i.e. the count value in each module) based on the same reset signal used to rest the first time base in the controller 105, so that first and second time bases are synchronized with each other, and a start time in the first time base can be converted into a trigger value in the second time base.

The modules 150 convert the received start time $t_1$, which is according to the first time base, into a value or signal according to the second time base operating as a start trigger (step 510, equivalent to step 410). The start trigger is preferably determined relative to the reset signal 117 or reset time $t_0$. For example, where the first time base is standard 24 hour time and the second time base is a count value, and where the start time $t_1$ indicates a time of 8.5 seconds after reset time $t_0$, each module addressed by an instruction indicating the start time $t_1$ calculates a count value which will be accumulated by the module's counter when 8.5 seconds have elapsed from the reset time $t_0$.

In one alternative embodiment, the controller 105 itself determines a start trigger value $t_2$ in the second time base corresponding to the start time $t_1$ in the first time base and sends the start trigger in the instruction(s) to the relevant modules 120. In this embodiment a conversion from the first time base to the second time base is performed at the controller 105 and the modules are only provided with a start trigger value $t_2$ in accordance with the second time base.

The relevant one or more modules 150 (i.e. those modules to which the instruction was addressed to start an operation at start time $t_1$) then wait for their count circuit to accumulate a count value corresponding to the start trigger value $t_2$, and initiate the relevant operation according to the instruction received from the controller 105 (step 511, equivalent to step 411).

The reset time $t_0$, start time $t_1$, and/or start trigger $t_2$ can be sent as part of or separate from an instruction to schedule or perform an operation in one or more modules.

Figure 8:
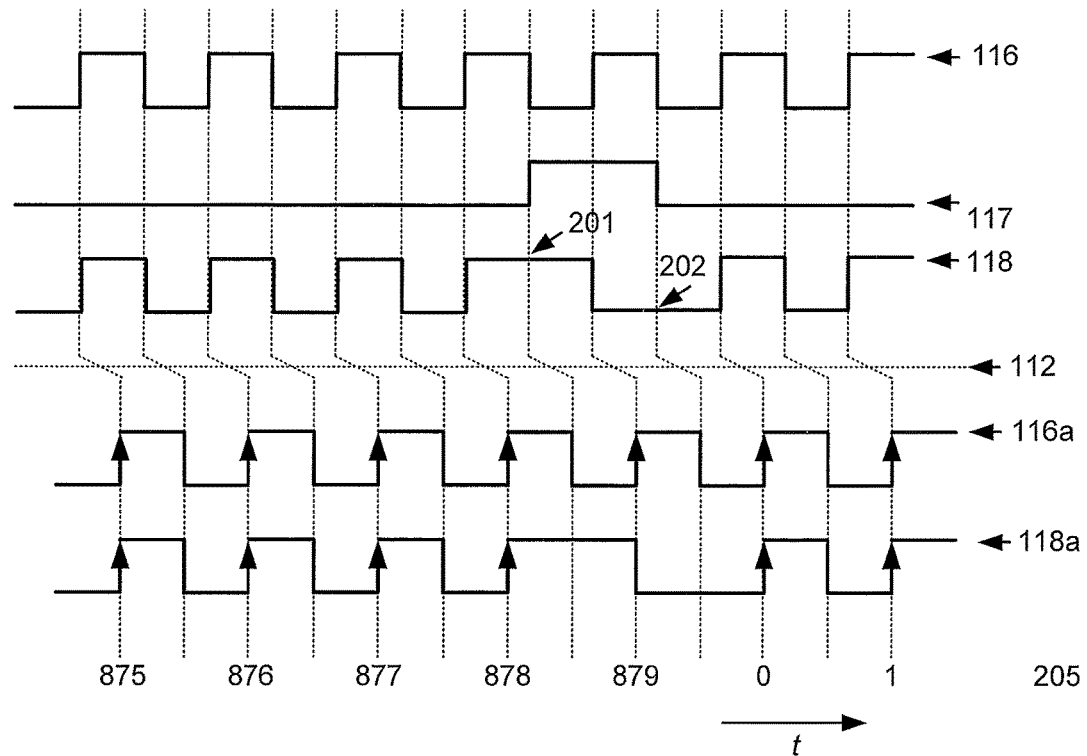
FIG. 8 shows an illustrative example of signaling in a control system according to the invention.

Another embodiment of a combined clock and sync signal 118 is illustrated in FIG. 8. A clock signal 116 and a sync (reset) signal 177 in the form of a pulse are combined using an XOR operation to generate combined clock/sync signal 118. The XOR combination results in a deviation in the repetitive clock signal 116 at 201 and 202. The signal 118 is transmitted over the network 112 as shown schematically by dotted line. The clock signal 116a and coded combined signal 118a including the coded sync/reset signal as received at a module 120 is shifted a relative amount due to processing and/or transmission delays. However, this delay is largely relative and reproducible. Furthermore, the second network 112 is preferably designed so that transmission delays of the clock signal to the modules 150 are similar among the modules, and the modules are preferably designed similarly to experience similar clock processing delays.

Figure 9:
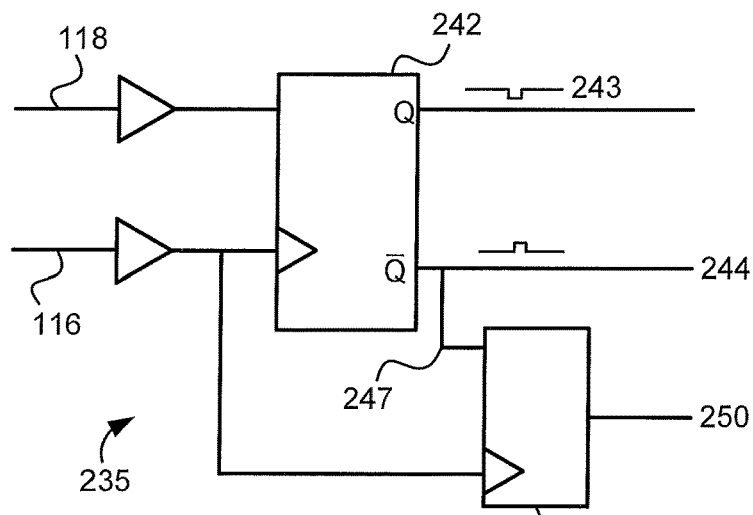
FIG. 9 is an embodiment of count and reset circuit for decoding and counting a master clock signal according to an embodiment of the invention.

In one embodiment, both the clock signal 116 and the combined clock/sync signal 118 are provided over the second network 112 to the modules 150. One embodiment of a combined count and reset circuit 235 is shown in FIG. 9. This circuit 235 may form the count circuit 125,135,145 and reset circuit 126,136,146 for the modules 150, and may also be included in the controller 105. The circuit 235 comprises a D-flipflop 242 and counter 245. The counter 245 receives the clock signal 116 and generates a count value 250, which may be an input to the processor 121,131,141 of the respective module 150. The D-flipflop 242 receives both the clock signal 116 (connected to the active low input) and the combined clock/sync signal 118, and generates a signal 243 and a counter reset signal 244, which may be used for logging. The counter reset signal 244 is connected to an input of counter 245, resulting in the reset of the counter if a deviation in the clock signal 116 occurs.

Tick number 220 as shown in FIG. 6 shows an exemplary numbering of the metronome signal 210.

Figure 10:
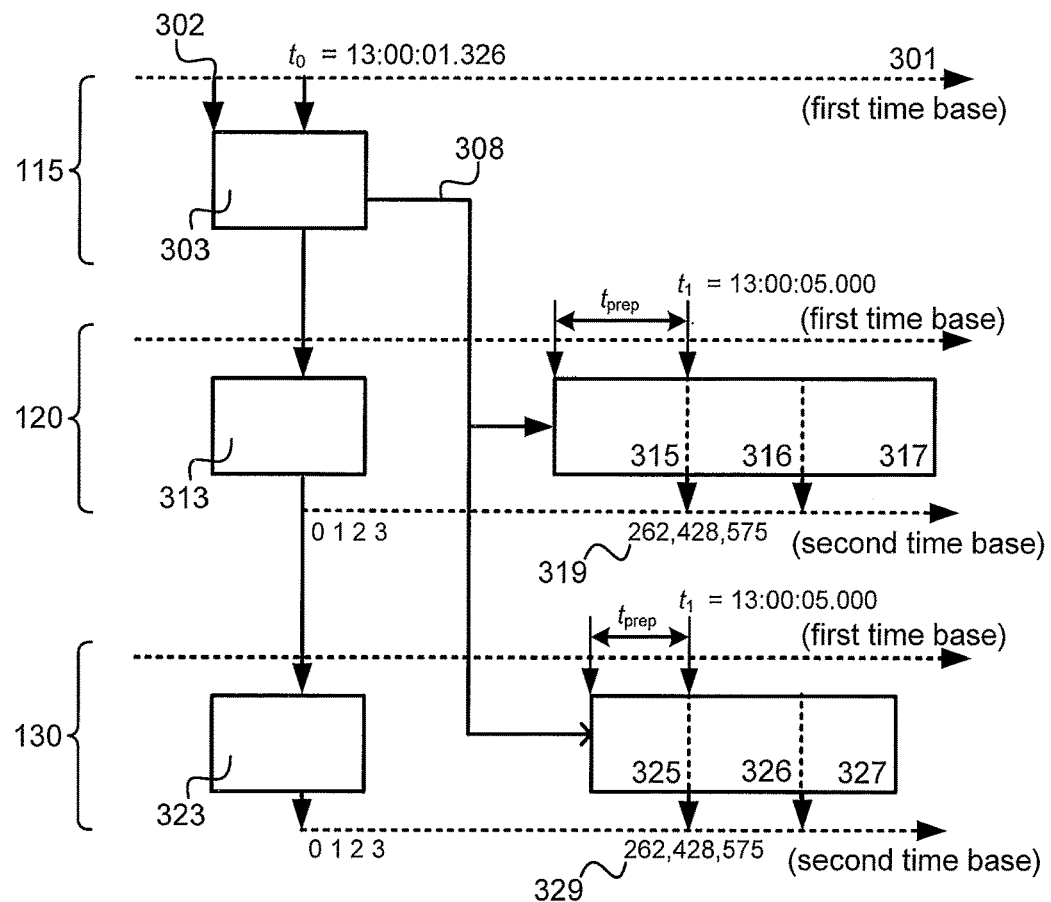
FIG. 10 shows another illustrative example of signaling in a control system according to the invention.

In one embodiment the controller 105 is arranged to send a reset instruction to the master clock 115, which subsequently performs a reset procedure as will be described hereunder and is illustrated in FIG. 10.

In an embodiment the master clock 115 has a clock circuit 118 in accordance with the first time base. This allows master clock 115 to calculate the reset time $t_0$ in the first time base and send this to the modules 120,130 to indicate at which time in the first time base that a reset was performed.

At time 302 a reset request is sent and the reset procedure 303 is performed. The master clock 115 transmits a reset signal to the modules 120,130 at reset time $t_0$=13:00:01.326 (in hours:minutes:seconds) in the first time base. As part of the reset procedure 303 the reset time $t_0$ is logged and may be provided to the modules 120 and 130. The count circuits 125,135 in the respective modules 120,130 are reset upon receipt of the reset signal.

An operation 316 is to be performed by module 120, and a different operation 326 is to be performed by module 130, with both operations to start at time $t_1$=13:00:05.000 in the first time base. This first start time can calculated and provided by the controller 105, taking into account the time needed to perform respective preparation operations 315 and 325 in the respective modules 120 and 130, which will take up a respective time $t_{prep}$.

In this example the master clock signal 116 has a frequency of 1/14 GHz. Since start time $t_1$ is 3.674 seconds after reset time $t_0$, and the count circuit 118 will count every cycle of the master clock signal 116, the start trigger value $t_2$ in the second time base can be calculated and sent to the modules 120 and 130.

In one embodiment start trigger values are limited by certain constraints. In an example, start trigger values can only take on counts that can be divided by 5. In this example start time $t_1$−reset time $t_0$=3.674 seconds, which corresponds to a start trigger value of time $t_2$=262,428,575 counts. The start trigger value $t_2$ corresponds with the same moment as the start time $t_1$ in the first time base. When the count value 319 of the count circuit 125 of module 120 reaches 262,428,575 (the first such count after start time $t_1$) after reset time $t_0$, the operation 316 is started in module 120. Similarly, when the count value 329 of the count circuit 135 of module 130 reaches 262,428,575 after reset time $t_0$, the operation 326 is started in module 130.

Although the operations 316 and 326 may not be initiated at exactly the same moment due to delays in the system, any such delays in starting the respective operations 316 and 326 will be reproducible, which will reduce e.g. overlay errors in a lithography process below 1.5 nm, preferably below 1 nm.

In this embodiment either the master clock 115 or the respective modules 120 and 130 may convert start time $t_1$ in the first time base into start trigger value $t_2$ in the second time base. In one embodiment, the processor 121,131 in each module 120.130 may convert the start time into the start trigger value, e.g. by taking into account the reset time and/or the frequency of the master clock signal 116 in combination with the trigger (e.g. each rising edge of the clock signal). The processor for performing this conversion may alternatively be provided in the controller 105 or elsewhere in the system. In one embodiment, the conversion instruction, including reset time $t_0$ and start time $t_1$ (and optionally also the frequency of the master clock signal 116 and/or the trigger property) are included in an instruction transmitted to the modules. In one embodiment the processor in each module further takes into account the respective preparation time start time $t_{prep}$ needed by each module to prepare for the respective operation performed by that module.

In the embodiment of FIG. 10, the respective operations 316,326 are followed by a respective wrap-up operation 317,327 in each module. The example of FIG. 10 illustrates a a circuit for increasing of the precision of synchronization of operations 316,326 in separate modules 120,130 without changes to the controller 105 of the lithography system. Thus, it is possible to lower the overlay error as a result of synchronization below 0.5 nm, since the beam deflection velocity in prior art devices is about 380 mm/s, which results in a maximum timing error of 0.5/0.380 ns=1.3 ns. Such accuracy can be obtained using a clock signal of 1/14 GHz with the rising edge as trigger property.

Further modifications in addition to those described above may be made to the structures and techniques described herein without departing from the spirit and scope of the invention. Accordingly, although specific embodiments have been described, these are examples only and are not limiting upon the scope of the invention.

What is claimed is:

1. A method for initializing a first operation in a first module at a start time value in a first time base, the method comprising:
   generating a clock signal;
   generating a second time base in the first module based on the clock signal;
   determining a second sync value in the second time base;
   determining a first sync value in the first time base corresponding to a second sync value in the second time base;
   determining a start trigger value in the second time base based on the first sync value and the start time value in the first time base; and
   initializing the first operation in the first module based on the start trigger value and a current value of the second time base in the first module,
   wherein the second time base is different from the first time base.

2. The method according to claim 1, wherein the second time base comprises a count value generated from the clock signal.

3. The method according to claim 1, wherein determining the first sync value comprises generating a sync signal, and determining the first sync value in dependence on a time of receipt of the sync signal in the first time base, and wherein the second sync value corresponds to a value in the second time base determined by receipt of the sync signal.

4. The method according to claim 3, wherein the sync signal is combined with the clock signal to form a single combined signal which is used for determining the first sync value (406) and determining the second sync value.

5. The method according to claim 1, wherein determining the start trigger value comprises determining a relative start time in the first time base based on the start time value and the first sync value, wherein the start trigger value is a value in the second time base corresponding to the relative start time in the first time base.

6. The method according to claim 2, wherein the start trigger value corresponds to a count value in the second time base corresponding to the relative start time in the first time base.

7. The method according to claim 2, wherein the first operation is initialised when the count value corresponds to the start trigger value.

8. The method according to claim 1, wherein the method further comprises initiating a second operation in a second module, comprising:
   generating the second time base in the second module based on the clock signal; and
   initializing the second operation in the second module based on the start trigger value and a current value of the second time base in the second module.

9. The method according to claim 8, wherein the second time base comprises a count value generated in each of the first and second modules from the clock signal.

10. The method according to claim 8, wherein the second sync value corresponds to a reset of the count value in each of the first and second modules.

11. A system for initializing a first operation in a first module at a start time value in a first time base, the system comprising:
    a clock for generating a clock signal;
    a count circuit for generating a second time base in the first module based on the clock signal;
    a first circuit for determining a first sync value in the first time base corresponding to a second sync value in the second time base;
    a second circuit for determining a start trigger value in the second time base based on the first sync value and the start time value in the first time base;
    wherein the first module comprises a third circuit for initializing the first operation in the first module based on the start trigger value and a current value of the second time base, and
    wherein the second time base is different from the first time base.

12. The system according to claim 11, wherein the circuit for generating the second time base comprises a count circuit for generating a count value from the clock signal.

13. The system according to claim 11, wherein the first circuit for determining a first sync value is adapted for determining the first sync value in dependence on a time of receipt of a sync signal in the first time base, and further comprising a fourth circuit for determining the second sync value, adapted for determining the second sync value corresponding to a value in the second time base determined by receipt of the sync signal by the first module.

14. The system according to claim 12, wherein the second sync value corresponds to a reset value of the count circuit.

15. The system according to claim 11, wherein the second circuit for determining a start trigger value is adapted to determine a relative start time in the first time base based on the start time value and the first sync value, wherein the start trigger value is a value in the second time base corresponding to the relative start time in the first time base.

16. The system according to claim 11, wherein the second circuit for determining a start trigger value is adapted to determine a relative start time in the first time base based on the start time value and the first sync value, wherein the start trigger value corresponds to a count value in the second time base corresponding to the relative start time in the first time base.

17. The system according to claim 11, wherein the third circuit for initializing the first operation is adapted to initialise the first operation when the count value corresponds to the start trigger value.

18. The system according to claim 11, wherein the system is further adapted for initiating a second operation in a second module, wherein the system further comprises:
    a fifth circuit for generating a second time base in the second module based on the clock signal;

wherein the second module comprises a sixth circuit for initializing the second operation in the second module based on the start trigger value and a current value in the second time base.

19. The system according to claim 18, wherein the second time base comprises a count value generated in each of the first and second modules from the clock signal.

20. The system according to claim 11, wherein the first module is one of a plurality of modules connected to a controller via a first network, and the controller transmits one or more instructions identifying the first operation via the first network to the first module.

21. A charged particle lithography system comprising:
 a charged particle beam source for producing a charged particle beam;
 an aperture array for generating a plurality of charged particle beamlets from the charged particle beam;
 a beam switching module including beamlet blanker array comprising blanking electrodes for blanking selected ones of the charged particle beamlets;
 a pattern data streaming module for transmitting pattern data to the beam switching module;
 a projection optics module including a beam deflector array for scanning the unblanked beamlets across the surface of a target;
 a moveable stage for carrying the target; and
 a stage control module for controlling movement of the moveable stage;
 the system further comprising a system according to claim 11.

22. The charged particle lithography system according to claim 21, wherein:
 the first module comprises the stage control module and the first operation comprises a predetermined movement of the stage during a scan;
 the second module comprises the projection optics module and the second operation comprises a predetermined scanning deflection of the unblanked beamlets across a surface of target; and
 the third module comprises the pattern data streaming module and the third operation comprises transmission of a predetermined portion of data to the beam switching module for blanking selected ones of the charged particle beamlets.

23. The method according to claim 1, wherein the first and second sync values represent the same instant in time.

24. The system according to claim 11, wherein the first and second sync values represent the same instant in time.

* * * * *